US011410849B2

United States Patent
Wang et al.

(10) Patent No.: US 11,410,849 B2
(45) Date of Patent: Aug. 9, 2022

(54) DEVICE AND METHOD FOR MEASURING FILM LONGITUDINAL TEMPERATURE FIELD DURING NITRIDE EPITAXIAL GROWTH

(71) Applicant: UNIVERSITY OF ELECTRONIC SCIENCE AND TECHNOLOGY OF CHINA, Sichuan (CN)

(72) Inventors: Chao Wang, Sichuan (CN); Ying Duan, Sichuan (CN); Jing Jiang, Sichuan (CN); Jun Hu, Sichuan (CN); Zezhan Zhang, Sichuan (CN); Yang Yang, Sichuan (CN); Xueke Gou, Sichuan (CN); Congjun Wu, Sichuan (CN)

(73) Assignee: UNIVERSITY OF ELECTRONIC SCIENCE AND TECHNOLOGY OF CHINA, Sichuan (CN)

( * ) Notice: Subject to any disclaimer, the term of this patent is extended or adjusted under 35 U.S.C. 154(b) by 440 days.

(21) Appl. No.: 16/618,354

(22) PCT Filed: Mar. 22, 2019

(86) PCT No.: PCT/CN2019/079371
§ 371 (c)(1),
(2) Date: Nov. 30, 2019

(87) PCT Pub. No.: WO2019/144974
PCT Pub. Date: Aug. 1, 2019

(65) Prior Publication Data
US 2021/0143014 A1   May 13, 2021

(30) Foreign Application Priority Data
Jan. 23, 2018 (CN) .......................... 201810061935.9

(51) Int. Cl.
*H01L 21/20* (2006.01)
*G02B 27/10* (2006.01)
(Continued)

(52) U.S. Cl.
CPC ............ *H01L 21/20* (2013.01); *G01J 5/0007* (2013.01); *G02B 27/10* (2013.01); *G02B 27/141* (2013.01);
(Continued)

(58) Field of Classification Search
None
See application file for complete search history.

(56) References Cited

U.S. PATENT DOCUMENTS

| 7,374,960 B1 * | 5/2008 | Bour ...................... H01L 33/007 438/77 |
| 2008/0128708 A1 * | 6/2008 | Jeong ...................... G01N 21/59 257/E29.089 |
| 2013/0343426 A1 * | 12/2013 | Gurary ...................... G01J 5/602 374/121 |

FOREIGN PATENT DOCUMENTS

| CN | 103592284 | * | 2/2014 | ............. G01N 21/65 |
| JP | 2016100601 | * | 5/2016 | ....... H01L 21/68771 |

* cited by examiner

*Primary Examiner* — Alexander G Ghyka

(57) ABSTRACT

The present invention designs a measurement scheme for the longitudinal temperature of the film during nitride epitaxial growth, belongs to the field of semiconductor measurement technology. Epitaxial growth technology is one of the most effective methods for preparing nitride materials. The temperature during the growth process restricts the performance of the device. The non-contact temperature measurement method is generally used to measure the temperature of the graphite disk as the base, which can't obtain the longitudinal temperature. The present invention respectively measures the surface temperature of the epitaxial layer and the tem-
(Continued)

perature of the graphite disk by ultraviolet and infrared radiation temperature measurement technologies, and then uses the finite element simulation method to perform thermal field analysis from the bottom surface of the substrate to the surface of the epitaxial layer, so that the longitudinal temperature is obtained, thereby providing a favorable basis for temperature regulation during nitride growth.

2 Claims, 3 Drawing Sheets

(51) Int. Cl.
  *G02B 27/30*   (2006.01)
  *H01L 21/02*   (2006.01)
  *H01L 21/66*   (2006.01)
  *G01J 5/00*   (2022.01)
  *G02B 27/14*   (2006.01)
  *H01L 21/64*   (2006.01)

(52) U.S. Cl.
  CPC .............. *G02B 27/30* (2013.01); *H01L 21/02* (2013.01); *H01L 21/0254* (2013.01); *H01L 21/64* (2013.01); *H01L 22/10* (2013.01); *H01L 22/12* (2013.01); *H01L 22/20* (2013.01); *H01L 22/30* (2013.01)

| P-GaN | 150 nm |
|---|---|
| P-AlGaN electron blocking layer | 60 nm |
| GaN layer | 11 nm |
| InGaN germanium layer | 2 nm |
| ⋮ | |
| GaN layer | 11 nm |
| InGaN germanium layer | 2 nm |
| n-GaN electrode contact layer | 2 μm |
| GaN | 2 μm |
| AlN buffer layer | 30 nm |
| Al₂O₃ substrate | 430 μm |

InGaN/GaN five layers

DEVICE AND METHOD FOR MEASURING FILM LONGITUDINAL TEMPERATURE FIELD DURING NITRIDE EPITAXIAL GROWTH

CROSS REFERENCE OF RELATED APPLICATION

This is a U.S. National Stage under 35 U.S.C. 371 of the International Application PCT/CN2019/079371, filed Mar. 22, 2019, which claims priority under 35 U.S.C. 119(a-d) to CN 201810061935.9, filed Jan. 23, 2018.

BACKGROUND OF THE PRESENT INVENTION

Field of Invention

The present invention relates to the field of semiconductor measurement technology, and discloses a method for measuring a longitudinal temperature field during nitride epitaxial growth.

Description of Related Arts

The third generation of wide bandgap semiconductors represented by nitride has become an important material for the preparation of optoelectronic devices due to their absolute advantages such as high stability, high photoelectric conversion capability, low energy loss, and high breakdown field strength. At present, the commonly used growth equipment for nitride is MOCVD (metal organic chemical vapor deposition), in which an epitaxial wafer is placed on a graphite disk of a heating device, the graphite disk is driven to rotate by a rotating shaft at a high speed, and the reactant is transported by the carrier gas (generally, hydrogen and nitrogen) through pipelines, and then enters a chamber through a shower plate, and then is deposited on a surface of the epitaxial substrate by reaction. The growth temperature of the epitaxial layer is a key parameter for controlling the production performance of the thin film growth reaction chamber. Due to strict reaction conditions of the thin film growth reaction chamber, growth circumstance with high temperature and active chemical property, high-speed rotating substrate, and strict equipment space arrangement are needed. Therefore, direct temperature measurement techniques such as thermocouples are almost impossible, so the growth temperature of the epitaxial layer must be measured by non-contact temperature measurement. In the prior art, for substrate materials which are transparent to infrared light, the near-infrared wavelength (such as 900-1000 nm) adopted by most of the radiation thermometers is able to pass through the epitaxial layer (gallium nitride) and its substrate material (usually sapphire), the near-infrared radiation measured by the instrument is emitted from the graphite heating disk located at the bottom surface of the substrate, so that the calculated temperature is the temperature of the graphite heating disk, not the surface temperature of the epitaxial layer itself. Generally, there is a temperature difference in a range of 3° C.-5° C. between the epitaxial layer and the graphite heating disk. When there is a large stress between the epitaxial layer and the substrate, the epitaxial layer is warped, so that this temperature difference will increase to several tens of degrees, which causes great errors for taking the temperature of the graphite heating disk acquired by real-time growth as the growth temperature of the epitaxial layer. At the same time, the temperature drift of the epitaxial layer will cause the light emission wavelength of the nitride to drift, resulting in a decrease in product yield. Although there is an ultraviolet temperature measurement method specifically for the surface of the epitaxial layer of the substrate which is transparent to infrared light, the longitudinal temperature measurement from the substrate to the epitaxial layer is unable to be achieved, and the temperature regulation of the different growth stages of the epitaxial layer is unable to be achieved.

SUMMARY OF THE PRESENT INVENTION

A technical problem to be solved of the present invention is to measure a longitudinal temperature field from a substrate to an epitaxial layer during nitride epitaxial growth, for further regulating a growth temperature of the nitride epitaxial layer at different stages, wherein the nitride is obtained by epitaxial growing on the substrate, and then is placed on a graphite disk for heating to rotate at high speed together, so as to obtain an epitaxial layer with uniform temperature distribution. A position relationship of the substrate and the graphite disk is shown in FIG. 3.

The entire measuring process comprises two steps of firstly measuring a temperature of a graphite disk located at a bottom surface of a substrate and a surface temperature of an epitaxial layer, respectively; and then obtaining a longitudinal temperature field from the substrate to the epitaxial layer through thermal field analysis. Infrared temperature measurement technology is able to estimate an actual temperature of an object by detecting an thermal radiation intensity of the object in a near-infrared band, and however, due to the large forbidden band width, all of sapphire, silicon carbide and silicon substrates commonly used in the preparation of nitride devices are unable to produce near-infrared radiation. These substrates are substantially incapable of transmitting the ultraviolet spectrum. In view of the above reasons, the surface temperature (namely, epitaxial growth temperature) of the epitaxial layer is able to be deduced by testing a spectral intensity of the near-ultraviolet wavelength, and a temperature (substrate heating temperature) of the graphite disk located at the bottom surface of the substrate is able to be obtained by spectral measurement in the near-infrared wavelength. After obtaining the temperature of the bottom surface of the substrate and the surface temperature of the epitaxial layer, the temperature of an intermediate layer is calculated by a finite element analysis method to obtain a vertical distribution image of the temperature from the epitaxial layer to the graphite heating disk.

A technical solution of the present invention is to provide a device for measuring a longitudinal temperature field of an epitaxially grown nitride, which has an infrared detection light path and an ultraviolet detection light path, wherein:

the infrared detection light path comprises an infrared radiation detection light sub-path and an infrared reflection detection light sub-path, wherein:

the infrared radiation detection light sub-path is defined by an optical probe, a second optical fiber, a second fiber coupler, a collimating mirror set, a second dichroic mirror, a second focusing lens, a second optical filter and a third detector, wherein: infrared light is radiated by an object to be measured, and then passes through the optical probe, the second optical fiber, the second fiber coupler, the collimating mirror set, the second dichroic mirror, the second focusing lens and the second optical filter in sequence, and finally reaches the third detector;

the infrared reflection detection light sub-path is defined by a light source with a wavelength in a range of 940 to 1050 nm, a first collimating lens, a first beam splitter, a first detector, a first dichroic mirror, a first fiber coupler, a first optical fiber, the optical probe, the second optical fiber, the second fiber coupler, the collimating mirror set, the second dichroic mirror, the second focusing lens, the second optical filter and the third detector, wherein: light, from the light source with the wavelength in the range of 940 to 1050 nm, passes through the first collimating lens and is divided into two beams of light by the first beam splitter, one beam of light is detected by the first detector, another beam of light passes through the first dichroic mirror, the first fiber coupler, the first optical fiber and the optical probe in sequence, and then illuminates the object to be measured, and then is reflected by the object to be measured, and then reflected light of the object to be measured passes through the optical probe, the second optical fiber, the second fiber coupler, the collimating mirror set, the second dichroic mirror, the second focusing lens, the second optical filter and the third detector in sequence;

the ultraviolet detection light path comprises an ultraviolet radiation detection light sub-path and an ultraviolet reflection detection light sub-path, wherein:

the ultraviolet radiation detection light sub-path is defined by the optical probe, the second optical fiber, the second fiber coupler, the collimating mirror set, the second dichroic mirror, a first focusing lens, a first optical filter and a fourth detector, wherein ultraviolet light is radiated by the object to be measured, and then passes through the optical probe, the second optical fiber, the second fiber coupler, the collimating mirror set, the second dichroic mirror, the first focusing lens and the first optical filter in sequence, and finally reaches the fourth detector;

the ultraviolet reflection detection light sub-path is defined by a light source with a wavelength in a range of 400 to 450 nm, a second collimating lens, a second beam splitter, a second detector, the first dichroic mirror, the first fiber coupler, the first optical fiber, the optical probe, the second optical fiber, the second fiber coupler, the collimating mirror set, the second dichroic mirror, the first focusing lens, the first optical filter and the fourth detector, wherein: light, from the light source with the wavelength in the range of 400 to 450 nm, passes through the second collimating lens and is divided into two beams of light by the second beam splitter, one beam of light is detected by the second detector, another beam of light is reflected by the first dichroic mirror and then passes through the first fiber coupler, the first optical fiber and the optical probe in sequence, and then illuminates the object to be measured, and then is reflected by the object to be measured, and then reflected light of the object to be measured passes through the optical probe, the second optical fiber, the second fiber coupler, the collimating mirror set, the second dichroic mirror, the first focusing lens, the first optical filter and the fourth detector in sequence;

all of the light source with the wavelength in the range of 940 to 1050 nm, the light source with the wavelength in the range of 400 to 450 nm, the first detector, the second detector, the third detector and the fourth detector are controlled by the computer.

A specific probe optical system is shown in FIG. 2.

A method for measuring a longitudinal temperature field of an epitaxially grown nitride, which comprises steps of:

(S1) measuring an infrared radiation intensity of a graphite disk;

(S2) irradiating the graphite disk with infrared light, measuring a reflectivity of the graphite disk to the irradiated infrared light, subtracting the reflectivity of the graphite disk from one, and obtaining an emissivity of the graphite disk;

(S3) measuring an ultraviolet radiation intensity of a surface of an epitaxial layer;

(S4) irradiating the epitaxial layer with ultraviolet light, measuring a reflectivity of the epitaxial layer to the irradiated ultraviolet light, subtracting the reflectivity of the epitaxial layer from one, and obtaining an emissivity of the epitaxial layer;

(S6) calculating a temperature of the graphite disk and the epitaxial layer through a formula of $$M = \varepsilon(\lambda, T) * \frac{C_1}{\lambda^5} [\exp(C_2/\lambda T) - 1]^{-1},$$

wherein M is a radiation intensity of an object to be measured, $\lambda$ is a measuring wavelength, T is temperature, $\varepsilon(\lambda,T)$ is an emissivity of the object to be measured with a wavelength of $\lambda$ and a temperature of T, C1 and C2 are respectively known first and second radiation constants; and (S7) establishing the longitudinal temperature field of the epitaxially grown nitride according to the temperature of the graphite disk and the temperature of the epitaxial layer.

A device and a method for measuring a longitudinal temperature field of an epitaxially grown nitride are provided by the present invention. The temperature of the graphite disk located at a bottom surface of the substrate and the temperature of the epitaxial layer located on a top surface of the substrate are respectively measured by using infrared radiation light and ultraviolet radiation light, and then the longitudinal temperature field of the epitaxially grown nitride is established. The longitudinal temperature field of the epitaxially grown nitride has advantages of high precision and good real-time performance.

DETAILED DESCRIPTION OF THE PREFERRED EMBODIMENT

A measurement process of a longitudinal temperature field provided by the present invention comprises two steps as follows.

Step 1: Measuring a temperature of a bottom surface (graphite disk) of a substrate and a surface temperature of an epitaxial layer of the substrate, respectively.

According to a preferred embodiment of the present invention, sapphire ($Al_2O_3$) is selected as a substrate material, and then a gallium nitride LED (light emitting diode) epitaxial layer is grown on the substrate material. A near-ultraviolet wavelength in a range of 400 to 450 nm is selected. Since a growth temperature of the gallium nitride epitaxial layer is about 1000° C., according to the Wien displacement theorem, a maximum response wavelength is 1700 nm, so that a selected wavelength must be below 1700 nm. Combined with that gas such as $CO_2$ and $H_2O$ in a reaction chamber absorbs less radiation near 1000 nm, an infrared wavelength in a range of 940 to 1050 nm is selected for radiation reception. An LED light source is embodied as a light source with a corresponding wavelength.

Figure 1:
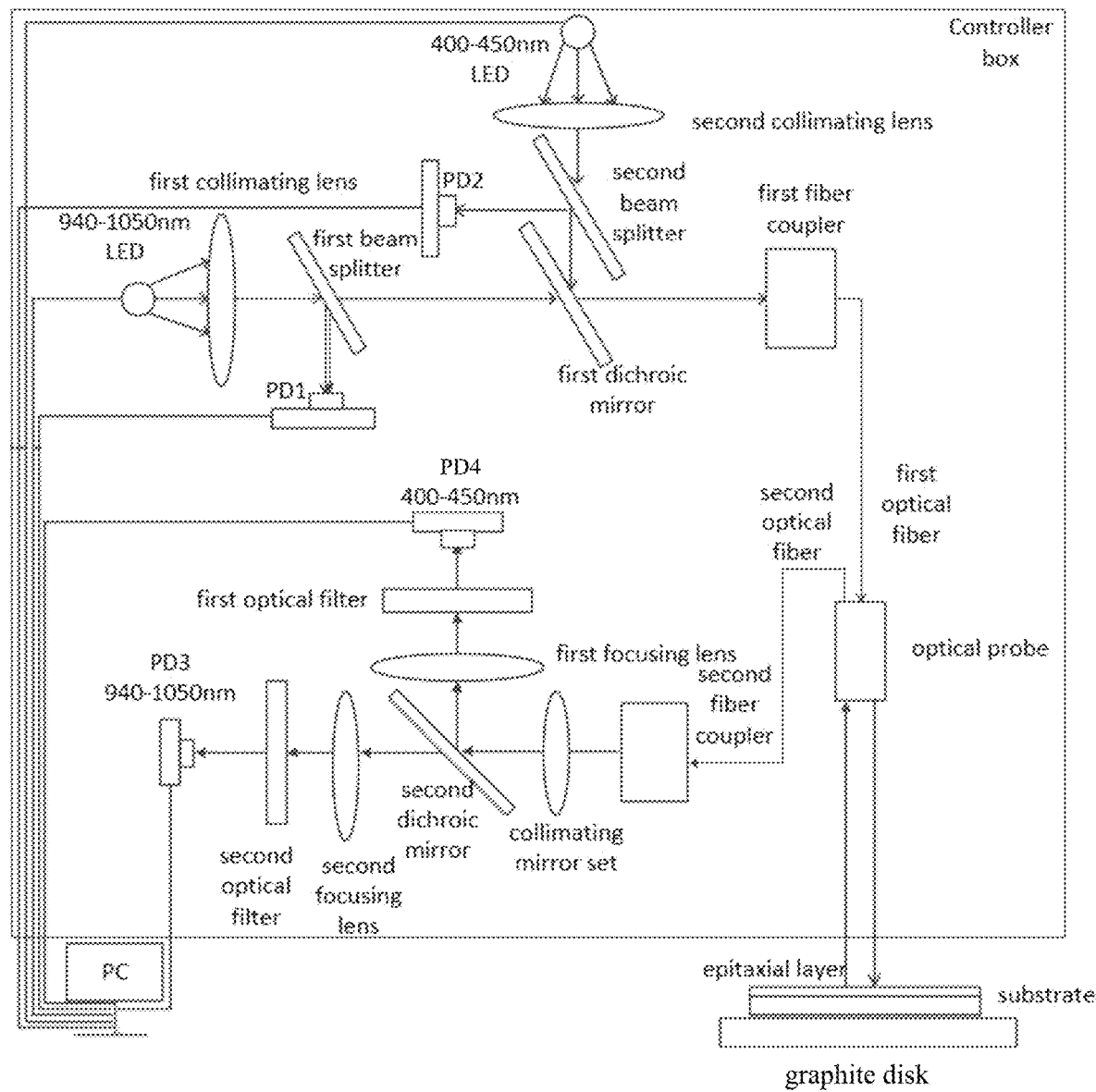
FIG. 1 is an overall optical path schematic diagram.

A specific optical path of the present invention is shown in FIG. 1.

When a temperature of a graphite disk is measured, infrared radiation from the graphite disk is focused by an optical probe, and then a radiation signal is transmitted to a third detector PD3 by a second fiber coupler via a second optical fiber after filtering light in a certain wavelength by a second dichroic mirror and light-focusing by a second focusing lens, and infrared radiation M emitted from the graphite disk at this temperature is received by the PD3. After obtaining the heat radiation of the graphite disk, the surface emissivity of the graphite disk is measured next. An infrared LED light source with a wavelength in a range of 940 to 1050 nm is applied, a part of the light is received by a first detector PD1 via a first beam splitter to measure an incident light intensity $M_{incident}$ of the graphite disk, another part of the light is transmitted to a first optical fiber via a first fiber coupler, and incident on the graphite disk through the optical probe, the reflected radiation is transmitted to the second optical fiber through the optical probe, and then received by the PD3 via the second fiber coupler, a collimating mirror set, the second dichroic mirror, the second focusing lens, and the second optical filter in sequence to measure a reflection light intensity $M_{reflection}$ of the graphite disk. Accordingly, a surface reflectivity of the graphite disk is denoted as $$\rho = \frac{Mreflection}{Mincident},$$

and a surface emissivity of the graphite disk is denoted as $\varepsilon=1-\rho$. The obtained thermal radiation M and the surface emissivity $\varepsilon$ are substituted into a brightness temperature measurement formula of $$M_0(\lambda, T) = \varepsilon(\lambda, T) * \frac{C_1}{\lambda^5} [\exp(C_2/\lambda T) - 1]^{-1}$$

to calculate the surface temperature of the graphite disk, that is, the temperature $T_1$ of the bottom surface of the substrate.

The process of measuring the surface temperature of the epitaxial layer is almost the same as that of the graphite disk. The difference is that gallium nitride is unable to produce infrared radiation due to the large forbidden band width. Therefore, ultraviolet detectors are used to measure the ultraviolet radiation emitted by the surface of the epitaxial layer due to the rising temperature. While measuring the emissivity, an LED light source in the ultraviolet wavelength is also used.

When the temperature of the epitaxial layer is measured, ultraviolet radiation from the epitaxial layer is received by the optical probe, and then a radiation signal is transmitted to a fourth detector PD4 by a second fiber coupler via a second optical fiber after filtering light in a certain wavelength by a first optical filter and light-focusing by a first focusing lens, and ultraviolet radiation M emitted from the gallium nitride epitaxial layer at this temperature is received by the PD4. After obtaining the heat radiation of the epitaxial layer, the surface emissivity of the epitaxial layer is measured next. An ultraviolet LED light source with a wavelength in a range of 400 to 450 nm is applied, a part of the light is received by a second detector PD2 via a second beam splitter to measure an incident light intensity $M_{incident}$ of the epitaxial layer, another part of the light is transmitted to the first optical fiber via the first fiber coupler, and incident on the epitaxial layer through the optical probe, the reflected radiation is transmitted to the second optical fiber through the optical probe, and then received by the PD4 via the second fiber coupler, the collimating mirror set, the second dichroic mirror, the first focusing lens, and the first optical filter in sequence to measure a reflection light intensity $M_{reflection}$ of the epitaxial layer. Accordingly, a surface reflectivity of the epitaxial layer is denoted as $$\rho = \frac{Mreflection}{Mincident},$$

and a surface emissivity of the epitaxial layer is denoted as $\varepsilon=1-\rho$. The obtained thermal radiation M and the surface emissivity $\varepsilon$ are substituted into the brightness temperature measurement formula of $$M_0(\lambda, T) = \varepsilon(\lambda, T) * \frac{C_1}{\lambda^5} [\exp(C_2/\lambda T) - 1]^{-1}$$

to calculate the surface temperature $T_2$ of the epitaxial layer.

After obtaining the two temperatures, Step 2 is performed, that is, obtaining a longitudinal temperature field from the bottom surface of the substrate to the surface of the epitaxial layer by using thermal field analysis software ansys.

According to the preferred embodiment of the present invention, a gallium nitride epitaxial layer grown on a sapphire substrate is taken as an example to illustrate a method for measuring a longitudinal temperature field of the thin film during nitride epitaxial growth.

Figures 4, 5:
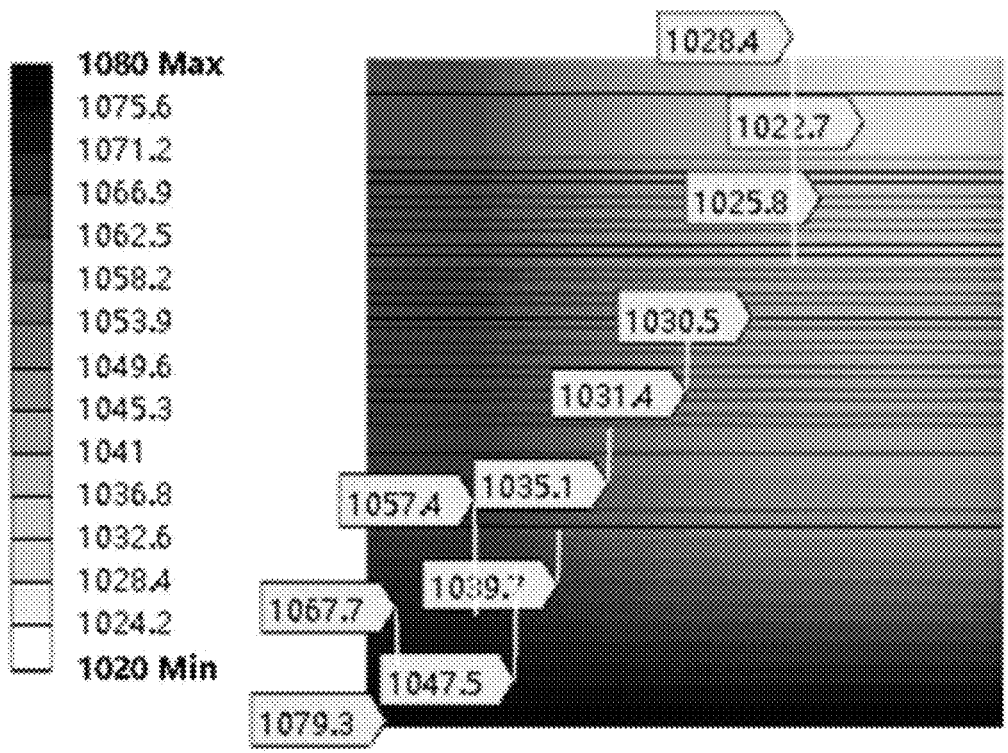
FIG. 4 is an epitaxial growth structural diagram.
FIG. 5 is a simulation diagram of a longitudinal temperature field of a substrate-epitaxial layer.

The model is built as shown in FIG. 4.

Substrate is embodied as sapphire ($Al_2O_3$) with a diameter of 2 inches and a thickness of 430 μm, and a temperature of a bottom surface of the substrate is defined as a temperature of the graphite disk $T_1$.

Figure 2:
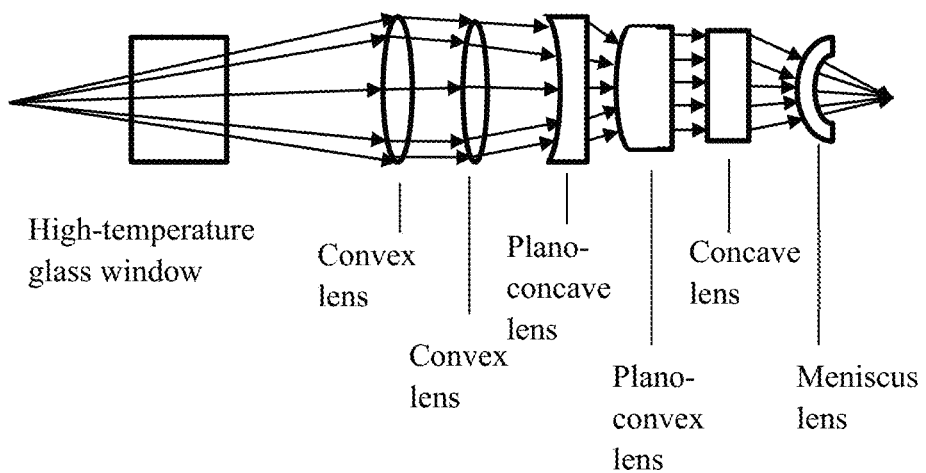
FIG. 2 shows a probe optical system.
Figure 3:
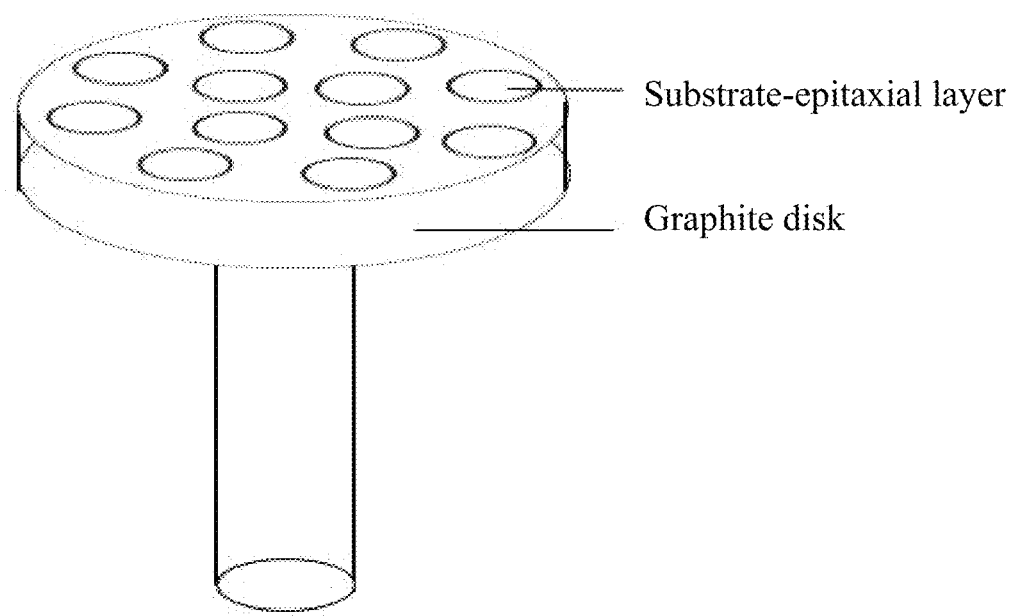
FIG. 3 is a structurally schematic view of a rotary table.

Epitaxial layer comprises a buffer layer, a quantum germanium layer and an electrode contact layer. The specific material and thickness parameters of the epitaxial layer are shown in FIG. 2. A diameter of the epitaxial layer is 2 inches and a temperature of an upper surface of the epitaxial layer is defined as $T_2$.

Boundary Conditions:

An epitaxial growth process is described as follows. A substrate is put on a reactor which is located on a supporter, gases carry materials in a bottle and doping onto a surface of the substrate, and then an epitaxial layer with a certain thickness and quality is grown on the substrate through precise parameter control such as temperature, gas flow rate and time by the computer. Therefore, it is necessary to provide parameters such as the environment and the gas flow rate inside the reaction chamber.

(1) Wall Conditions of Reactor:

The wall is assumed to be slip free, so the speed on the wall is zero. As the wall is a double-layer quartz glass tube with circulating cooling water, the wall temperature is fixed at 300 K.

(2) Internal Conditions of Reactor:

The initial temperature inside the reactor is 295 K and the pressure is 0.2 atm.

(3) Gas Inlet Conditions:

The gas inlet velocity is 0.1 m/s. It can be thought that the gas flow in the reaction chamber is laminar. The initial temperature of the inflow gas is 300 K.

The above parameters and thermal property parameters such as the thermal conductivity and the specific heat of the material are input into the ansys software to obtain the longitudinal temperature field from the bottom surface of the substrate to the surface of the epitaxial layer, as shown in FIG. 5. After obtaining the longitudinal temperature field, the temperature value information of the epitaxial growth layer can be read out layer by layer, so as to achieve the purpose of macroscopically controlling the growth temperature of the epitaxial layer.

What is claimed is:

1. A device for measuring a longitudinal temperature field of an epitaxially grown nitride, which has an infrared detection light path and an ultraviolet detection light path, and comprises a computer, wherein:
the infrared detection light path comprises an infrared radiation detection light sub-path and an infrared reflection detection light sub-path, wherein:
the infrared radiation detection light sub-path is defined by an optical probe, a second optical fiber, a second fiber coupler, a collimating mirror set, a second dichroic mirror, a second focusing lens, a second optical filter and a third detector, wherein: infrared light is radiated by an object to be measured, and then passes through the optical probe, the second optical fiber, the second fiber coupler, the collimating mirror set, the second dichroic mirror, the second focusing lens and the second optical filter in sequence, and finally reaches the third detector;
the infrared reflection detection light sub-path is defined by a light source with a wavelength in a range of 940 to 1050 nm, a first collimating lens, a first beam splitter, a first detector, a first dichroic mirror, a first fiber coupler, a first optical fiber, the optical probe, the second optical fiber, the second fiber coupler, the collimating mirror set, the second dichroic mirror, the second focusing lens, the second optical filter and the third detector, wherein: light, from the light source with the wavelength in the range of 940 to 1050 nm, passes through the first collimating lens and is divided into two beams of light by the first beam splitter, one beam of light is detected by the first detector, another beam of light passes through the first dichroic mirror, the first fiber coupler, the first optical fiber and the optical probe in sequence, and then illuminates the object to be measured, and then is reflected by the object to be measured, and then reflected light of the object to be measured passes through the optical probe, the second optical fiber, the second fiber coupler, the collimating mirror set, the second dichroic mirror, the second focusing lens, the second optical filter and the third detector in sequence;
the ultraviolet detection light path comprises an ultraviolet radiation detection light sub-path and an ultraviolet reflection detection light sub-path, wherein:
the ultraviolet radiation detection light sub-path is defined by the optical probe, the second optical fiber, the second fiber coupler, the collimating mirror set, the second dichroic mirror, a first focusing lens, a first optical filter and a fourth detector, wherein ultraviolet light is radiated by the object to be measured, and then passes through the optical probe, the second optical fiber, the second fiber coupler, the collimating mirror set, the second dichroic mirror, the first focusing lens and the first optical filter in sequence, and finally reaches the fourth detector;
the ultraviolet reflection detection light sub-path is defined by a light source with a wavelength in a range of 400 to 450 nm, a second collimating lens, a second beam splitter, a second detector, the first dichroic mirror, the first fiber coupler, the first optical fiber, the optical probe, the second optical fiber, the second fiber coupler, the collimating mirror set, the second dichroic mirror, the first focusing lens, the first optical filter and the fourth detector, wherein: light, from the light source with the wavelength in the range of 400 to 450 nm, passes through the second collimating lens and is divided into two beams of light by the second beam splitter, one beam of light is detected by the second detector, another beam of light is reflected by the first dichroic mirror and then passes through the first fiber coupler, the first optical fiber and the optical probe in sequence, and then illuminates the object to be measured, and then is reflected by the object to be measured, and then reflected light of the object to be measured passes through the optical probe, the second optical fiber, the second fiber coupler, the collimating mirror set, the second dichroic mirror, the first focusing lens, the first optical filter and the fourth detector in sequence;
all of the light source with the wavelength in the range of 940 to 1050 nm, the light source with the wavelength in the range of 400 to 450 nm, the first detector, the second detector, the third detector and the fourth detector are controlled by the computer.

2. A method for measuring a longitudinal temperature field of an epitaxially grown nitride, which comprises steps of:
(S1) measuring an infrared radiation intensity of a graphite disk;
(S2) irradiating the graphite disk with infrared light, measuring a reflectivity of the graphite disk to the irradiated infrared light, subtracting the reflectivity of the graphite disk from one, and obtaining an emissivity of the graphite disk;
(S3) measuring an ultraviolet radiation intensity of a surface of an epitaxial layer;
(S4) irradiating the epitaxial layer with ultraviolet light, measuring a reflectivity of the epitaxial layer to the irradiated ultraviolet light, subtracting the reflectivity of the epitaxial layer from one, and obtaining an emissivity of the epitaxial layer;
(S6) calculating a temperature of the graphite disk and the epitaxial layer through a formula of $$M = \varepsilon(\lambda, T) * \frac{C_1}{\lambda^5} [\exp(C_2/\lambda T) - 1]^{-1},$$

wherein M is a radiation intensity of an object to be measured, $\lambda$ is a measuring wavelength, T is temperature, $\varepsilon(\lambda,T)$ is an emissivity of the object to be measured with a wavelength of $\lambda$ and a temperature of T, C1 and C2 are respectively known first radiation constants; and (S7) according to the temperature of the graphite disk and the epitaxial layer, building the longitudinal temperature field of the epitaxially grown nitride.

\* \* \* \* \*